Figure 1:
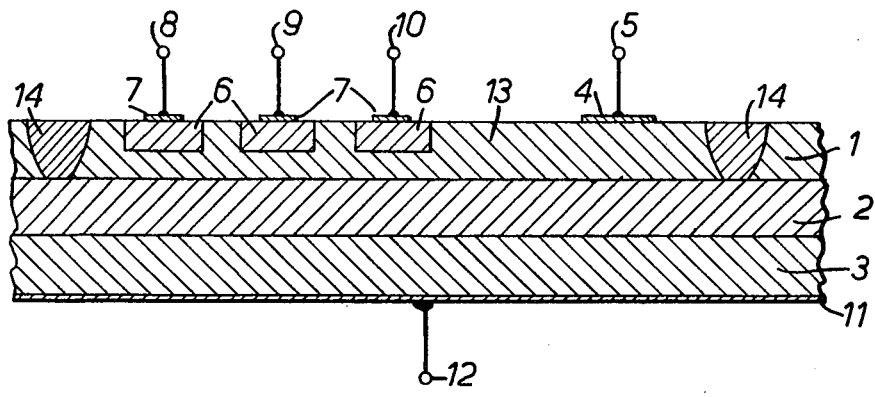

United States Patent [19]
Blatt

[11] 3,961,351
[45] June 1, 1976

[54] IMPROVEMENT IN OR RELATING TO INTEGRATED CIRCUIT ARRANGEMENTS

[75] Inventor: Victor Blatt, Northampton, England

[73] Assignee: Plessey Handel und Investments A.G., Zug, Switzerland

[22] Filed: Nov. 7, 1974

[21] Appl. No.: 521,893

[30] Foreign Application Priority Data
Nov. 8, 1973 United Kingdom............... 51856/73

[52] U.S. Cl................................. 357/15; 357/36; 357/40; 357/48
[51] Int. Cl.$^2$.................. H01L 29/48; H01L 29/56
[58] Field of Search.................. 357/36, 44, 46, 48, 357/15

[56] References Cited
UNITED STATES PATENTS

| | | | |
|---|---|---|---|
| 3,585,412 | 6/1971 | Hodges et al.......................... | 357/15 |
| 3,623,925 | 11/1971 | Jenkins et al....................... | 357/22 X |
| 3,823,353 | 7/1974 | Berger et al....................... | 357/46 X |

OTHER PUBLICATIONS

Wiedmann, "Injection–Coupled Memory: A High Density Static Bipolar Memory," IEEE Journal Of Solid–State Circuits, Oct. 1973 vol. SC-8, No. 5 pp. 332–337.

Primary Examiner—James B. Mullins
Attorney, Agent, or Firm—Fleit & Jacobson

[57] ABSTRACT

An integrated circuit arrangement having at least one pair of superposed transistor structures which provides very high packing density and low power consumption. The arrangement includes first, second and third superposed semiconductive layers, the second layer being interposed between, and of the opposite conductivity type to, the first and third layers, and having a doping density higher than the first layer but lower than the third layer. At least one electrical contact is formed on a surface of the first layer and a plurality of spaced-apart semiconductive regions of the same conductivity type as the second layer are formed in the said surface of the first layer. An electrical contact is provided for each of the semiconductive regions and a layer of an electrical contact material is formed on a surface of the third layer. The doping density of the first layer can be such that the said at least one electrical contact forms a Schottky diode with the first layer.

7 Claims, 4 Drawing Figures

IMPROVEMENT IN OR RELATING TO INTEGRATED CIRCUIT ARRANGEMENTS

The invention relates to integrated circuit arrangements which have a particular but not necessarily an exclusive application in the realisation of multicollector logic configurations.

The invention provides an integrated circuit arrangement having at least one pair of superposed transistor structures, the arrangement including first, second and third superposed semiconductive layers, the second layer being interposed between, and of the opposite conductivity type to, the first and third layers and having a doping density higher than the first layer but lower than the third layer; at least one electrical contact formed on a surface of the first layer; a plurality of spaced-apart semiconductive regions of the same conductivity type as the second layer formed in the said surface of the first layer; an electrical contact for each of the semiconductive regions; and a layer of an electrical contact material formed on a surface of the third layer. The doping density of the first layer can be such that the said at least one electrical contact forms a Schottky diode with the first semiconductive layer. An integrated circuit arrangement having a plurality of pairs of superposed transistor structures can be realised by making the second and third semiconductive layers common to all of the said pairs and by having separate isolated sections of the first semiconductive layer associated with each of the said pairs.

Figure 2:
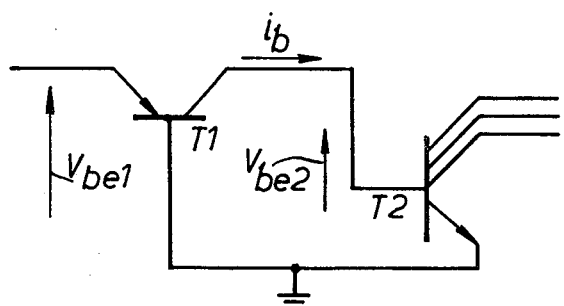
Figure 3:
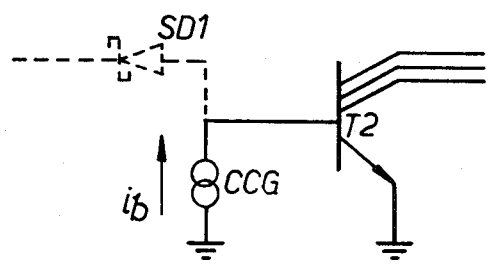
Figure 4:
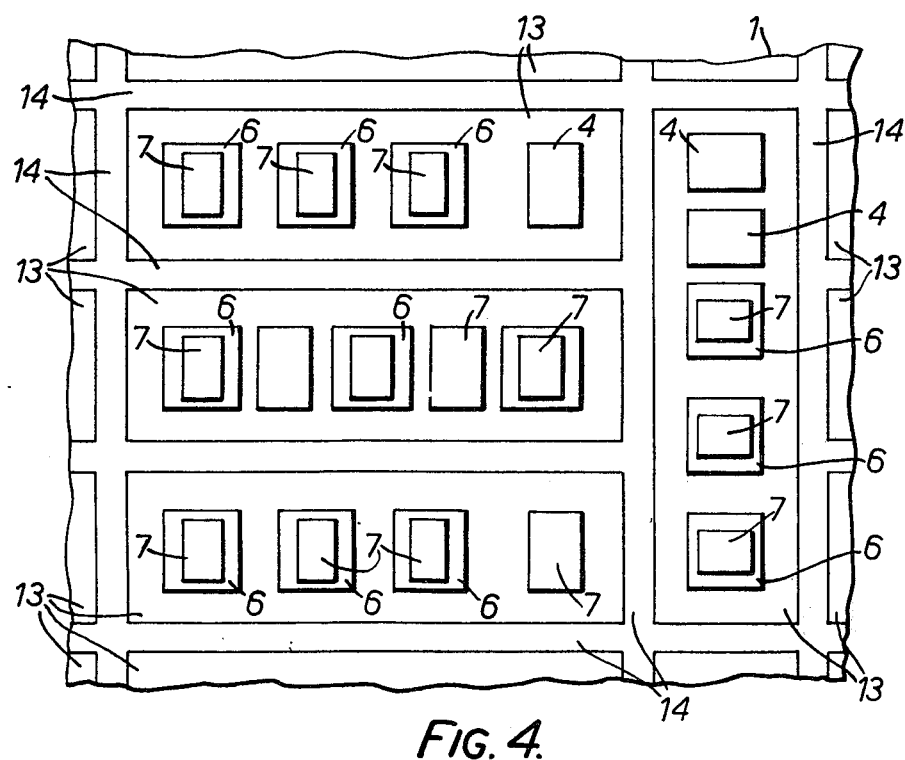

The foregoing and other features according to the invention will be better understood from the following description with reference to the accompanying drawings, in which;

FIG. 1 diagrammatically illustrates in a cross-sectional side elevation an integrated circuit arrangement according to the invention, FIG. 2 illustrates a multicollector logic configuration, FIG. 3 illustrates the equivalent circuit of the logic configuration of FIG. 2, and FIG. 4 diagrammatically illustrates in a plan view an array of the integrated circuit arrangements according to the invention.

An integrated circuit arrangement according to the invention is diagrammatically illustrated in FIG. 1 of the drawings and includes three superposed semiconductive layers 1, 2 and 3 which can be formed in this configuration by any known manner. The layer 2 is of the opposite conductivity type to the layers 1 and 3 and has a doping density which is higher than the layer 1 but lower than the layer 3.

An electrical contact 4 is formed, in any known manner, on the surface of a region 13 of the layer 1 and is connected to a terminal 5. The region 13 is isolated from the remainder of the layer 1 by a surrounding section 14 which is of the same conductivity type as the layer 2, for example n-type but of higher carrier concentration. The section 14 can be a diffused or implanted region. Alternatively, the surrounding section 14 could be removed, for example by etching, in order to effect the isolation, or the section 14 could be of a dielectric material.

A number, for example three, spaced-apart regions 6 of the same conductivity type as the layer 2 are formed in any known manner in the surface of the region 13 of the layer 1. An electrical contact 7 is formed, in any known manner, on each of the semiconductive regions 6 and these electrical contacts are each connected to a separate terminal, for example the terminals 8, 9 and 10.

A layer 11 of an electrical contact material is formed, in any known manner, on the surface of the layer 3 and is connected to a terminal 12.

In one example of the integrated circuit arrangement according to FIG. 1, the layer 2 and the semiconductive regions 6 can be of n-type conductivity in which case the layers 1 and 3 would be of p-type conductivity.

The doping density of the layer 1 can be such that the electrical contact 4 forms a Schottky diode with the layer 1. If desired, further electrical contacts 4 could be formed on the layer 1 in order to provide further Schottky diodes. Typical doping densities for the layers 1, 2 and 3 are respectively $3 \times 10^{15}$, $1 \times 10^{17}$ and $5 \times 10^{18}$. Also, the doping of the regions 6 and the layer 1 is such that the multicollector transistor will have a relatively high gain.

The integrated circuit arrangement according to the invention consists of two superposed transistor structures i.e. a pnp transistor beneath a multicollector npn transistor in the exampled arrangement given in a preceding paragraph.

The integrated circuit arrangement according to the invention is particularly useful in the realisation of multicollector logic configurations.

Multicollector logic (MCL) is known and, as is illustrated in FIG. 2 of the drawings, consists of a pnp transistor T1 whose collector is connected to the base of a multicollector npn transistor T2. The base of the transistor T1 and the emitter of the transistor T2 are both connected to earth potential.

If the base-emitter voltage $V_{be1}$ of the transistor T1 is kept constant then the base current $i_b$ of the transistor T2 will also be constant. Under these conditions the MCL of FIG. 2 can be represented by the equivalent circuit illustrated in FIG. 3 of the drawings wherein the transistor T1 is shown as a constant current generator CCG.

In operation, the base-emitter voltage $V_{be2}$ of the transistor T2 must be less than $V_{be1}$ in order to ensure that the transistor T1 does not saturate heavily. The basic logic characteristic of this gate is that of an inverter with many separate outputs, the outputs being the collectors of the transistor T2 and the input being the base of the transistor T2. A gate of this type can be used to drive a similar gate by connecting one of its outputs to the input of the other gate.

Thus, with the exampled integrated circuit arrangement given in a preceding paragraph, the pnp transistor T1 would formed by the region 13 of the layer 1 and the layers 2 and 3 and the multicollector npn transistor T2 would be formed by the semiconductive regions 6, the region 13 of the layer 1 and the layer 2.

When the doping density of the layer 1 of FIG. 1 is low enough to form a Schottky diode between the electrical contact 4 and the layer 1, the equivalent circuit of FIG. 3 will be modified in the manner indicated by the broken line i.e. a Schottky diode SD1 will be connected to the base of the transistor T2.

It should be noted that within practical limits any number of the semiconductive regions 6 can be provided in the region 13 of the layer 1, the number that is provided being dependent on the requirements of the multicollector transistor T2.

With the exampled integrated circuit arrangement, the $V_{be1}$ of the transistor T1 is approximately 150 millivolts higher than the $V_{be2}$ of the transistor T2. This means that the pnp transistor T1 will not be saturated during operation and therefore the efficiency of the transistor T1 as a current source will be relatively high. As a consequence of this efficiency the delay power factor of the MCL will be reduced in comparison to known arrangements.

A plurality of isolated regions could be formed in the layer 1 in order to provide a plurality of MCL's in a single structure. With this arrangement the layers 2 and 3 would be common to all the MCL's and the desired number of semiconductive regions 6 would be formed in, and the desired number of electrical contacts 4 would be formed on, each of the isolated regions of the layer 1.

A typical arrangement for an array of MCL's in a single structure is diagrammatically illustrated in FIG. 4 of the drawings in a plan view. As illustrated in FIG. 4, each region 13 of the layer 1 and the associated semiconductive regions 6 and electrical contacts 4 and 7 are isolated from the other regions by the surrounding isolation sections 14.

The various doped regions can be grown epitaxially, diffused or implanted in the arrangement illustrated in FIG. 4.

Each of the MCL's of the array can be utilised as an element in the construction of a variety of logic functions, for example, bistables, modulo-2 adders etc.

Also, the interconnected isolation sections 14 can be used as the negative power supply rail, for the layer 2 i.e. the bases of the transistors T1 and the emitters of the transistors T2, by arranging for the resistivity of the sections 14 to be of a suitable low value. This feature therefore eliminates the need for a separate negative supply rail and because the positive supply is applied to the terminal 12 (see FIG. 1), the whole of the surface area of the arrangement is available for logical interconnections.

When Schottky diodes are formed between the electrical contacts 4 and the layer 1, the contacts 4 now being the gate inputs have the effect of (a) clamping the bases of the transistors T2 resulting in a reduction in the voltage swing of the base of the transistor T2 and in the delay power product, (b) providing, when a number of contacts 4 are formed on each region 13, logic circuit elements with multi-inputs as well as multi-outputs and (c) allowing direct compatibility with transistor-transistor logic (TTL). Also, because the bases of the transistors T2 are connected through Schottky diodes, there cannot be current hogging and therefore many inputs can be connected together and be driven from a common rail or gate input.

The superposed transistor structures give rise to an integrated circuit arrangement with a very high packing density and low power consumption and the surface area normally consumed by known arrangements for a particular circuit configuration is considerably reduced. Some other factors which give rise to the high packing density are (a) only about a $6\mu$ clearance is needed between the regions 13 in order to effect isolation as compared with $14\mu$ required by the known lateral pnp injection methods, (b) the logic potentiality of multi-input/multi-output gates means that less gates are required than normal for a given logic function (c) the number of gates for a given logic function is also reduced, when compared with other known injection logic techniques, because of the fact that a number of gates can be driven from a common rail or gate input, (d) the higher npn $h_{FE}$ provided by this structur allows the use of smaller collectors thereby giving rise to a large increase in packing density, (e) the use of the isolation sections 14 for interconnection purposes between the regions 13 of the layer 1 simulate the use of multi-level interconnection patterns.

It should be noted that an integrated circuit arrangement exhibiting the same basic features outlined in preceding paragraphs could be realised in semiconductor areas of reversed polarity i.e. an npn transistor beneath a multicollector pnp transistor.

It should also be noted that the integrated circuit arrangements according to the invention include the possibility of having conventional transistors and resistors allowing the construction of any analogue or digital bipolar circuits in the same chip.

It is to be understood that the foregoing description of specific examples of this invention is made by way of example only and is not to be considered as a limitation in its scope.

What is claimed is:

1. An integrated circuit arrangement having at least one pair of superposed transistor structures, the arrangement including first, second and third superposed semiconductive layers, the second layer being interposed between, and of the opposite conductivity type to, the first and third layers and having a doping density higher than the first layer but lower than the third layer; a plurality of electrical contacts formed on a surface of the first layer to provide multi-inputs for the integrated circuit, said first layer having a doping density such that each of said plurality of electrical contacts forms a Schottky diode with the first layer; a plurality of spaced-apart semiconductive regions of the same conductivity type as the second layer formed in the said surface of the first layer; an electrical contact for each of the semiconductive regions to provide multi-outputs for the integrated circuit; and a layer of an electrical contact material formed on a surface of the third layer.

2. An integrated circuit arrangement as claimed in claim 1 wherein the second layer and the semiconductive regions are of n-type conductivity and wherein the first and third layers are of p-type conductivity.

3. An integrated circuit arrangement as claimed in claim 1 wherein the doping density of the first layer and the semiconductive regions is arranged so that the gain of a multicollector transistor formed by the semiconductive regions and the first and second layers is relatively high.

4. An integrated circuit arrangement as claimed in claim 1 having a plurality of pairs of superposed transistor structures wherein the second and third layers are common to all of the said pairs and wherein the first layer is divided into a number of separate sections which are isolated from each other and which are each associated with a separate one of the said pairs, each of the separate sections having a plurality of electrical contacts formed on the surface thereof to provide multi-inputs for each of said sections, said first layer in each of said separate sections having a doping density such that each of said plurality of electrical contacts forms a Schottky diode therewith, a plurality of the said spaced-apart semiconductive regions formed in the surface thereof and an electrical contact for each of the semiconductive regions to provide multi-outputs for each of said sections.

5. An integrated circuit arrangement as claimed in claim 4 wherein each of the separate sections is isolated from the adjacent separate sections by a strip of a semiconductive material which is of the same conductivity type as the second layer but of higher carrier concentration.

6. An integrated circuit arrangement as claimed in claim 4 wherein each of the separate sections is isolated from the adjacent separate sections by a strip of a dielectric material.

7. An integrated circuit arrangement as claimed in claim 4 wherein the separate sections are isolated from each other by an interconnected isolation strip which is adapted to provide an electrical contact rail for the second layer.

* * * * *